United States Patent [19]

Ochii

[11] 4,417,328

[45] Nov. 22, 1983

[54] RANDOM ACCESS SEMICONDUCTOR MEMORY DEVICE USING MOS TRANSISTORS

[75] Inventor: Kiyofumi Ochii, Yokohama, Japan

[73] Assignee: Tokyo Shibaura Denki Kabushiki Kaisha, Japan

[21] Appl. No.: 230,000

[22] Filed: Jan. 30, 1981

[30] Foreign Application Priority Data

Jan. 31, 1980 [JP] Japan .................................. 55-10259
May 26, 1980 [JP] Japan .................................. 55-69943

[51] Int. Cl.³ .............................................. G11C 7/00
[52] U.S. Cl. .................................................. 365/203
[58] Field of Search ..................................... 365/203

[56] References Cited

U.S. PATENT DOCUMENTS 4,044,341  8/1977  Stewart et al. ................. 365/203

OTHER PUBLICATIONS

"Polysilicon-Load RAMs Plug into Mainframes or Microprocessors", David Huffman 9/27/79, *Electronics*, pp. 131-139.

*Primary Examiner*—George G. Stellar
*Attorney, Agent, or Firm*—Finnegan, Henderson, Farabow, Garrett & Dunner

[57] ABSTRACT

A semiconductor memory device which comprises data lines each connected with memory cells, a precharging circuit for precharging the data lines, and an address signal state transition detector to detect a state transition of an address signal to cause the precharging circuit to precharge the data lines. The semiconductor memory device further comprises a data line voltage level detect circuit for detecting the voltage level of the data lines being precharged to minimize the precharging period of data lines, and a flip-flop circuit which causes the precharging circuit to precharge the data lines when an address signal state transition is detected by the address signal state transition detector, and which disables the precharging circuit from precharging the data lines when it is detected by the voltage level detect circuit that the data lines have been precharged to a predetermined voltage level.

4 Claims, 5 Drawing Figures

RANDOM ACCESS SEMICONDUCTOR MEMORY DEVICE USING MOS TRANSISTORS

Random access memories (hereinafter referred to as RAM's) using MOS transistors may be classified into two types; dynamic RAM's and static RAM's. The dynamic RAM's use memory cells which store data through stored charges in memory node capacitors. The static RAM's, on the other hand, use as their memory cells flip-flop circuits which store data statically. Nowadays, the dynamic RAM's can be formed of single-transistor memory cells, so that they are highly suited for large scale integration. The static RAM's are easy to use due to their capability of permanent data storage and are suited for high-speed operation because a signal is read out with a relatively large voltage swing. Recently, there have been efforts to reduce power consumption in write, read, and storage modes, for both the dynamic and static RAM's. From this point of view, the static RAM's are required to have such properties as simplicity (easiness in use) of memory system as viewed from the user's standpoint, capability of high-speed operation, and low power consumption.

With respect to operation, the static RAM's may be classified into two types, synchronous and asynchronous. The synchronous RAM's need to produce a synchronizing signal to be used for synchronously controlling various parts for each memory cycle. Accordingly, they chiefly perform such dynamic operations as charging and discharging electric charges. This permits, a circuit design with removed or reduced DC current paths, so that operating speed is improved and power consumption is reduced. On the other hand, the necessity of a synchronizing signal mitigates against simplicity (easiness in use) of the memory system.

The asychronous RAM's are so constructed that a memory cycle is automatically advanced to the next memory cycle in response to a change of address signal without producing a synchronizing signal for each memory cycle. Therefore, the asynchronous RAM's are superior to the synchronous RAM's in the simplicity of memory system. Using no synchronizing signal, however, the asynchronous RAM's require DC current paths for connecting data lines connected with memory cells to a power source through resistors, thus increasing power consumption.

FIG. 1 shows a synchronous or asynchronous one-bit memory cell used in a static RAM, and FIG. 2 shows voltage-current characteristic curves for illustrating the operation of the memory cell. As shown in FIG. 1, P-channel MOS transistors 1 and 2 are combined respectively with N-channel MOS transistors 3 and 4 to constitute CMOS inverters 5 and 6. The CMOS inverters 5 and 6 are cross-coupled as shown to form a flip-flop circuit. N-channel MOS transistors 7 and 8, with their gates connected together to a word line W, are connected between an output node A of inverter 5 and a data line D and between an output node B of inverter 6 and a data line $\overline{D}$, respectively. Generally, in a synchronous RAM, the data lines D and $\overline{D}$ are connected to a power source $V_{DD}$ through switching MOS transistors whose gates receive a common clock pulse. In an asynchronous RAM, on the other hand, the data lines D and $\overline{D}$ are connected to the power source $V_{DD}$ through pull-up resistors.

In FIG. 2, the axes of abscissa and ordinate represent voltage V at the node A and current I, respectively. The solid-line curve corresponds to current flowing from node A into inverter 5, representing the feedback characteristic of the flip-flop circuit. The broken-line curves represent the transfer characteristic of the transistor 7 with current flowing through transistor 7 into node A taken to be positive. The memory cell is stabilized at intersections of the solid line and the broken lines. Further, the region marked with leftwardly declined lines is a data read region or bistable region where the solid-line and broken-line curves intersect at two or more points. The region marked with rightwardly declined lines is a data write region or monostable region where the solid-line and broken-line curves intersect only at one point.

Referring to FIG. 2, there will now be described an operation to write data in the memory cell shown in FIG. 1. To write data of a logic level 0 (low level) into the node A, an access signal is applied to the word line W with the potentials on the data lines D and $\overline{D}$ kept lower and higher than a critical voltage Vcri respectively, thereby allowing the transistors 7 and 8 to conduct. At this time, the data line D is in the "0" write region, while the data line $\overline{D}$ is not in the write region, so that the node A is stabilized at logic level 0. Namely, data "0" is written in the node A. On the other hand, data of a logic level 1 (high level) is written into the node A and data "0" is written into the node B by reversing the relationship between the potentials on the data lines D and $\overline{D}$.

In order to read data from the memory cell, moreover, it is necessary to set the potentials of both data lines D and $\overline{D}$ higher than the critical voltage Vcri. When the access signal is applied to the word line W in this state, the respective operating points of the nodes A and B and the data lines D and $\overline{D}$ shift to their corresponding points of intersection in the read region in accordance with stored data. If voltages of data lines D and $\overline{D}$ are so set as to remain at points of intersections in the read region during the read period, the data can be read out without being destroyed, so that the next memory cycle can immediately be initiated.

However, if the read operation is executed in such a manner that one of the data lines D and D remains in the write region at the end of the read period, it is necessary to set the operating point of the data line quickly in the read region for executing the next memory cycle. To this end, the asynchronous static RAM is so designed that the data lines D and $\overline{D}$ are coupled to the power source $V_{DD}$ through pull-up resistors to keep the voltages of the data lines D and $\overline{D}$ higher than Vcri at all times. Thus, although the power consumption is increased, the memory cycle can be advanced immediately to facilitate the operation of the memory system.

In the synchronous static RAM, on the other hand, the operating points of data lines D and D are set in the read region by precharging the data lines D and $\overline{D}$ only at the beginning of the read period. Upon reading data, charges on one of data lines D and $\overline{D}$ are discharged into the memory cell, and the operating point of such one data line is shifted into the write region. Since only charging and discharging of electric charges occur in the synchronous static RAM, the low power consumption can be realized. This static RAM, however, requires a clock signal for precharging the data lines D and $\overline{D}$, which spoils the simplicity of memory system.

In brief, the synchronous static RAM is advantageous in power consumption, while the asynchronous static RAM is favorable for the simplicity of memory system.

There is hardly any difference between these two types in operating speed.

Recently, static RAM's having the low power consumption property of synchronous static RAM's and the simplicity of asynchronous static RAM's have been put to practical use. The RAM's of this type are provided with an address signal transition detector which detects the change of memory cycle on the basis of a change of address input signal. An output signal of the address signal transition detector is supplied to a synchronous static RAM to precharge the data lines D and $\overline{D}$, thereby causing the synchronous static RAM to perform like an asynchronous static RAM.

In such a static RAM, the precharging period of data lines D and $\overline{D}$ depends on the duration of the output signal of the address signal transition detector. The duration of the output signal of the address signal transition detector varies from RAM to RAM due to process variation of load MOS transistor, for example, used in integrated circuits, as mentioned later. Accordingly, the precharging period need be excessively long so that the data lines D and D may be fully precharged. Thus, it becomes difficult to operate the RAM at high speed.

An object of this invention is to provide a semiconductor memory device having the low power consumption property of a synchronous static RAM and the simplicity of an asynchronous static RAM and being capable of high-speed operation.

Another object of the invention is to provide a semiconductor memory device arranged so that data lines are precharged in response to a state transition of an address signal, the voltage level of the data lines is monitored during the precharging period, and the precharging of the data lines is terminated when the data lines are precharged to a predetermined voltage level.

The above objects of the invention may be attained by providing a semiconductor memory, which comprises an address signal state transition detector for detecting the state transition of an address signal and a precharging circuit for precharging data lines each connected with a plurality of memory cells in response to the detection of the state transition of the address signal, with a detecting circuit to detect the voltage level of the data lines and a control circuit connected to the address signal state transition detector and the voltage level detect circuit, the control circuit assuming a first state when a state transition of the address signal is detected, thereby causing the precharging circuit to precharge the data lines, and assuming a second state when the data lines are precharged to a predetermined voltage level, thereby disabling the precharging circuit from precharging the data lines.

According to a first embodiment of the invention, the voltage level detect circuit includes a dummy data line having substantially the same load capacitance as that of each of the data lines each connected with the memory cells, a dummy data line precharging circuit controlled by the control circuit, and a dummy data line voltage level detector which is connected to the dummy data line and causes the control circuit to assume the second state when the dummy data line is precharged to the predetermined voltage level.

According to a second embodiment of the invention, the voltage level detect circuit includes a data line voltage level detector which is connected to a pair of data lines connected with the memory cells and causes the control circuit to assume the second state when the data line is precharged to the predetermined voltage level.

This invention can be more fully understood from the following detailed description when taken in conjunction with the accompanying drawings, in which.

Figure 3:
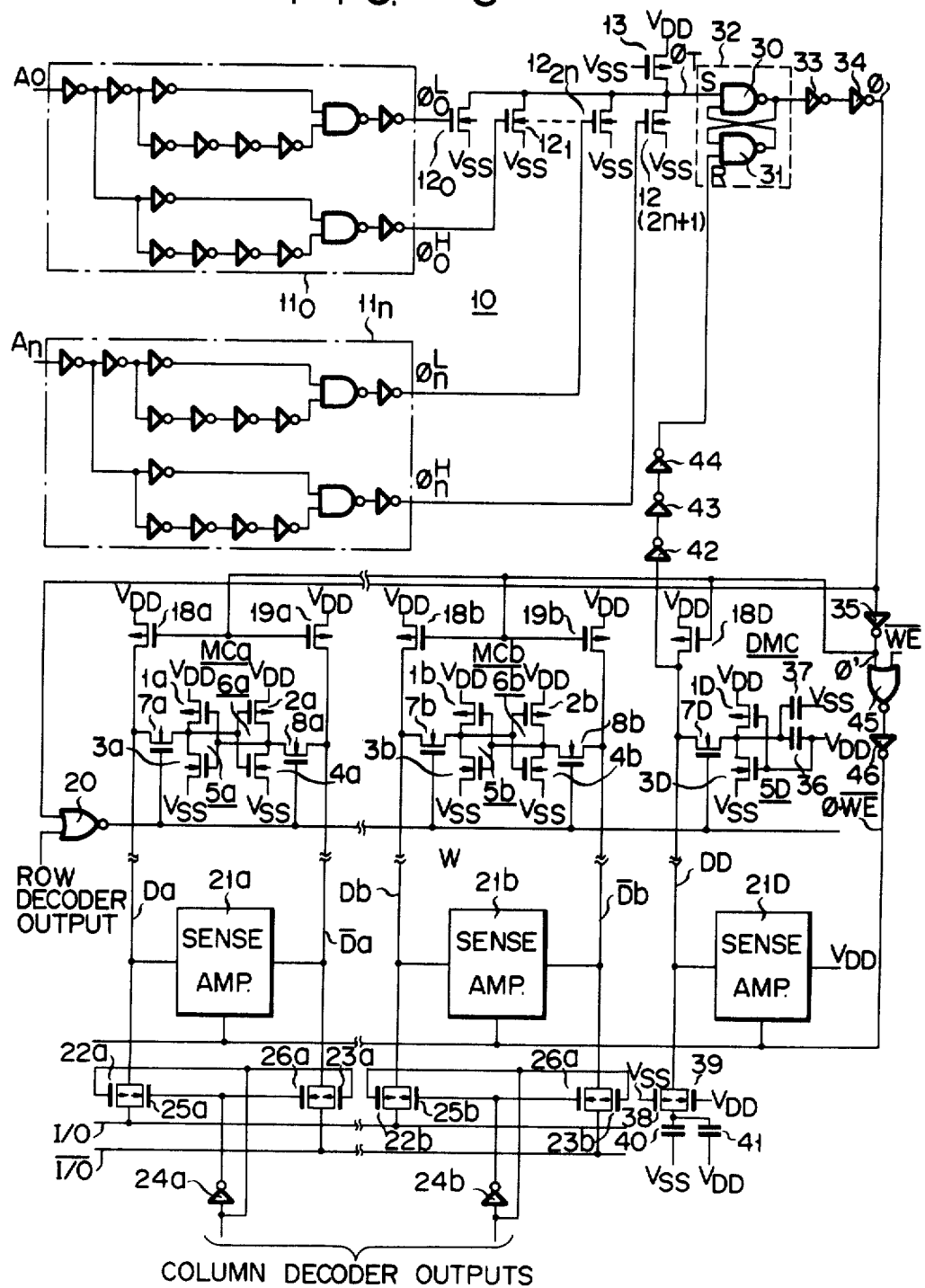
FIG. 3 shows a semiconductor memory device according to a first embodiment of this invention.

An asynchronous static RAM according to a first embodiment of this invention, as shown in FIG. 3, includes a number of data lines, typically represented by Da, $\overline{Da}$, Db and $\overline{Db}$, and a dummy data line DD. The data lines Da and $\overline{Da}$ are connected with a number of memory cells, typically represented by a memory cell MCa, and a sense amplifier 21a. Likewise, the data lines Db and $\overline{Db}$ are connected with a memory cell MCb as a representative and a sense amplifier 21b. Also, the dummy data line DD is connected with a representative dummy memory cell DMC and a sense amplifier 21D.

Figure 1:
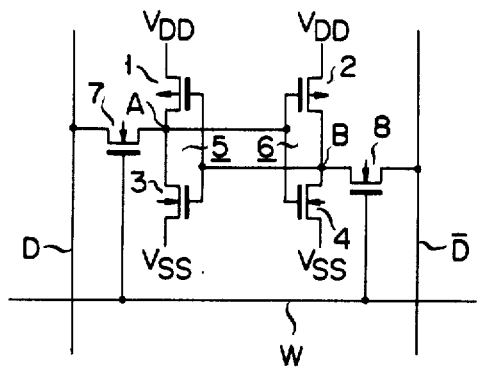
FIG. 1 is a circuit diagram of a prior art static memory cell.
Figure 2:
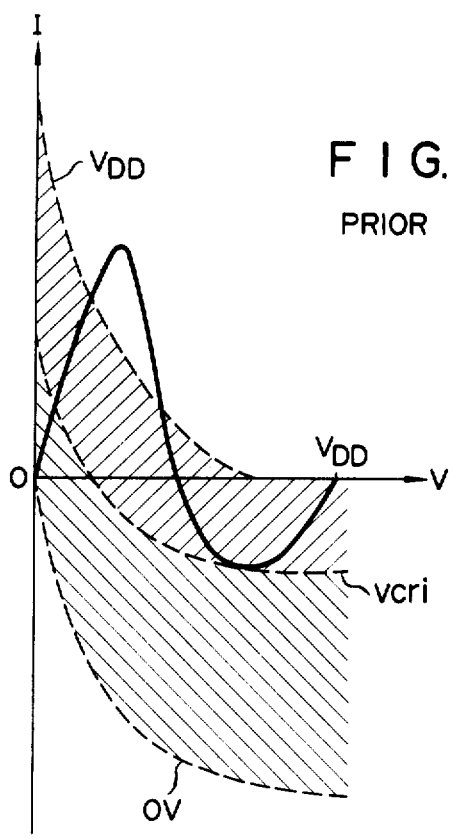
FIG. 2 shows voltage-current characteristic curves for illustrating the operation of the memory cell of FIG. 1.

The memory cells MCa and MCb are formed in the same configuration as the memory cell shown in FIG. 1 by MOS transistors 1a through 8a and 1b through 8b, respectively. The dummy memory cell DMC includes complementary MOS transistors 1D and 3D constituting a CMOS inverter 5D, and a transfer MOS transistor 7D which connects the output node of inverter 5D to the dummy data line DD. The gates of MOS transistors 1D and 3D are connected in common to a power source $V_{DD}$ (high level, e.g. +5 V). The output node of inverter 5D is also connected to the power source $V_{DD}$ and a power source $V_{SS}$ (low level, e.g. 0V) through capacitors 36 and 37, respectively.

The data lines Da and $\overline{Da}$ are connected to the power source $V_{DD}$ through P-channel precharging MOS transistors 18a and 19a, respectively. Likewise, the data lines Db and $\overline{Db}$ are connected to the power source $V_{DD}$ through P-channel precharging MOS transistors 18b and 19b, respectively. The dummy data line DD is connected to the power source $V_{DD}$ through a precharging MOS transistor 18D. Further, the data line Da is connected to an input-output line I/O via parallel-connected P-channel and N-channel MOS transistors 22a and 25a, while the data line $\overline{Da}$ is connected to another input-output line $\overline{I/O}$ via parallel-connected P-channel and N-channel MOS transistors 23a and 26a. Likewise, the data line Db is connected to the input-output line I/O via MOS transistors 22b and 25b, while the data line $\overline{Db}$ is connected to the input-output line $\overline{I/O}$ via MOS transistors 23b and 26b. The dummy data line DD is connected with one end of a parallel circuit of complementary MOS transistors 38 and 39, and the other end of the parallel circuit is connected to the power sources $V_{SS}$ and $V_{DD}$ through capacitors 40 and 41, respectively.

One output of a column decoder is connected directly to the gates of P-channel transistors 22a and 23a which are connected respectively to data lines Da and $\overline{Da}$, and is also connected to the gates of N-channel MOS transistors 25a and 26a through an inverter 24a. Another output of column decoder is connected directly to the gates of P-channel transistors 22b and 23b which are connected respectively to data lines Db and $\overline{Db}$, and is also connected to the gates of N-channel transistors 25b and 26b through an inverter 24b.

The dummy data line DD is formed to have substantially the same load capacitance as each of the data lines Da, $\overline{Da}$, Db and $\overline{Db}$, due to the fact that the MOS transistors related to dummy data line DD are formed to have the same dimensions as those of their corresponding MOS transistors related to data lines Da and Db and capacitors 36, 37, 40 and 41 are provided.

In the dummy memory cell DMC, the N-channel transistor 3D, having its gate supplied with $V_{DD}$, is always conductive. When the transistor 7D is turned on by raising a word line W, data "0" equivalent to $V_{SS}$ level is read out onto the dummy data line DD. Namely, whenever the dummy memory cell DMC is accessed together with memory cells MCa and MCb where the dummy data line DD is precharged to $V_{DD}$, the dummy data line DD is discharged.

Now an access signal transition detector 10 will be explained. The detector 10 includes signal delay circuits $11_0$ to $11_n$ which receive address signals $A_0$ to $A_n$, respectively. These delay circuits are each composed of inverters and NAND gates, as shown in FIG. 3. A signal delay circuit $11_i$ (i=0, 1, ... n) produces output signals $\phi_i^L$ and $\phi_i^H$ which go high for a given period of time, respectively, in response to negative and positive transitions of an address signal Ai.

Output signals $\phi_0^L$, $\phi_0^H$, ... $\phi_n^L$ and $\phi_n^H$ of the signal delay circuits $11_0$ to $11_n$ are connected, respectively, to the gates of N-channel MOS transistors $12_0$, $12_1$, ... $12_{2n}$ and $12_{(2n+1)}$ whose sources are connected in common to the power source $V_{SS}$. The drains of transistors $12_0$ to $12_{(2n+1)}$ are connected in common to the drain of a P-channel load MOS transistor 13 whose source and gate are connected to the power sources $V_{DD}$ and $V_{SS}$, respectively. Since the transistor 13 is always conductive, an output signal $\phi_T$ at the drain of transistor 13 is normally high, and will go low when one of transistors $12_0$ to $12_{(2n+1)}$ is turned on in response to the transition of the address signal.

The output signal $\phi_T$ is coupled to the set input S of an RS flip-flop circuit 32 composed of cross-coupled NAND gates 30 and 31. An output signal of flip-flop circuit 32 or output signal of NAND gate 30 goes high in response to $\phi_T$ going low. The output of flip-flop circuit 32 is coupled to cascade-connected inverters 33 and 34 to produce an output signal $\phi$. The output signal $\phi$ is coupled to one input of a NOR gate 20 the output of which is connected to the word line W and the other input of which is connected with one output of a row decoder. Also, the output signal $\phi$ is applied to an inverter 35 to produce an output signal $\phi'$.

The output signal $\phi'$ is applied to the gates of precharging transistors 18a, 19a, 18b, 19b and 18D, so that these transistors are turned on in response to the flip-flop circuit 32 being set, thereby starting the precharging of data lines Da, $\overline{Da}$, Db and $\overline{Db}$ and dummy data line DD. Further, the output signal $\phi'$, together with an inverted write enable signal $\overline{WE}$, is supplied to a NOR gate 45. An output signal of NOR gate 45 is supplied to an inverter 46 to produce a read control signal $\phi'\cdot\overline{WE}$ which is coupled to sense amplifiers 21a, 21b and 21D. When the read control signal $\phi'\cdot\overline{WE}$ goes high, the sense amplifiers 21a, 21b and 21D are activated to sense data stored in memory cells.

The dummy data line DD is coupled to the reset input R of flip-flop circuit 32 through a cascade connection of three inverters 42, 43 and 44. Accordingly, the flip-flop circuit 32 is reset when the voltage of dummy data line DD reaches a predetermined level as a result of precharging.

Figure 4:
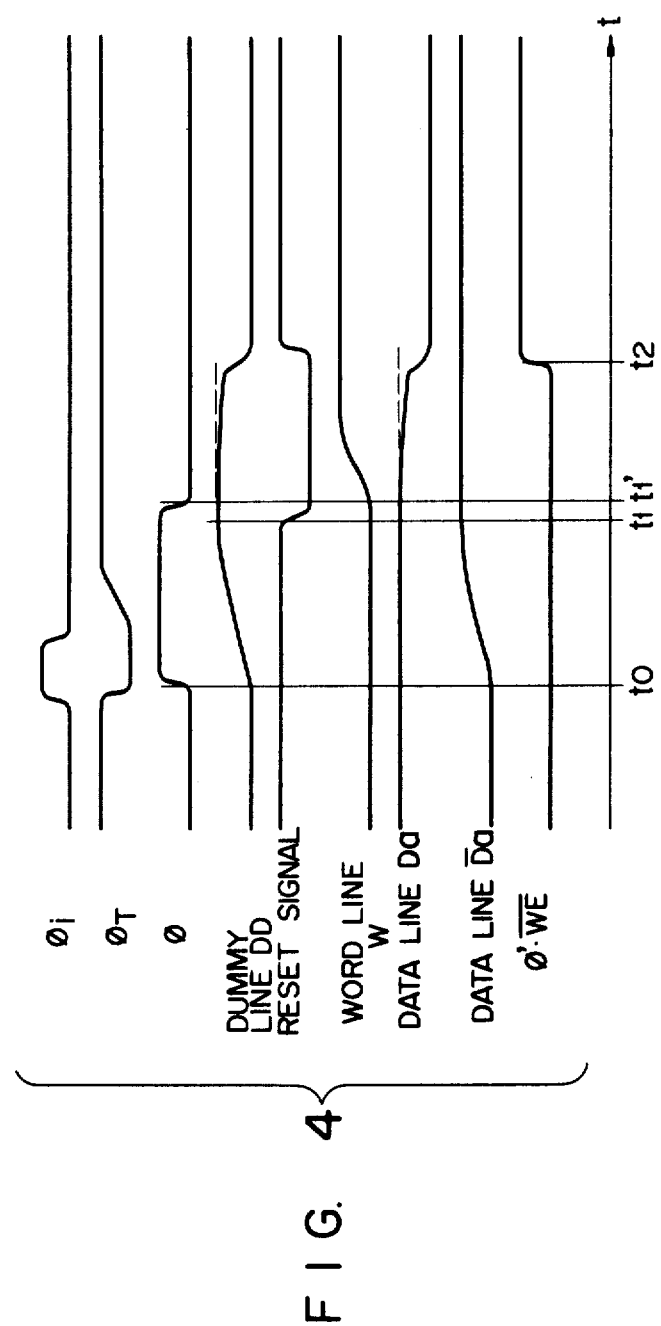
FIG. 4 is a timing diagram for illustrating the operation of the memory of FIG. 3.

Referring now to FIG. 4, there will be described the operation of the static RAM shown in FIG. 3.

When at least one (Ai) of the address signals $A_0$ to An goes low or high, the signal $\phi_i$ goes high for a given period. In response to the signal $\phi_i$ going high, one ($12_{2i}$ or $12_{(2i+1)}$) of transistors $12_0$ to $12_{(2n+1)}$ is turned on, so that the signal $\phi_T$ goes low to set the flip-flop circuit 32. In response to the flip-flop circuit 32 being set, the signal $\phi$ goes high at time $t_0$. When the signal $\phi$ goes high, the signal $\phi'$ goes low to turn on the precharging transistors 18a, 19a, 18b, 19b and 18D. As a result, the data lines and the dummy data line DD start to be precharged. It is to be noted that the data lines and the dummy data line are precharged at an equal speed since they have the same load capacitance as mentioned before. Out of a pair of data lines, one onto which data "0" is read out in the preceding read cycle is precharged. FIG. 4 shows a case in which the data line Da is precharged and the data line $\overline{Da}$ is at $V_{DD}$ level.

When the voltage level of the dummy data line DD reaches a predetermined level close enough to $V_{DD}$ after the start of the precharging, the inverter 42 detects such predetermined level to render its output signal low. The negative transition of the output signal of inverter 42 is transmitted to the reset input R of flip-flop circuit 32 via inverters 43 and 44, so that the flip-flop circuit 32 is reset at time $t_1$. The signal $\phi$ goes low at time $t_1'$ a moment after time $t_1$. When the signal $\phi'$ goes high in response to the signal $\phi$ going low, the precharging transistors 18a, 19a, 18b, 19b and 18D are all turned off to complete the precharging operation.

Thus, the precharging period (equivalent to the pulse duration of $\phi'$) can be determined by detecting precharging state of dummy data line which has an equal load capacitance to that of each data line. Accordingly, the precharging period of the RAM can be minimized.

Incidentally, the precharging period of the prior art RAM need be set fully long since it depends on the pulse duration of the signal $\phi_T$ which varies with the load characteristic of MOS transistor 13.

When an output signal of the row decoder to be applied to NOR gate 20 goes low after the completion of precharging, the potential of word line W goes high to turn on transistors 7a, 8a, 7b, 8b and 7D. In consequence, data are read out from memory cells MCa and MCb. When a given period of time has passed after the signal $\phi'$ had gone high or at time $t_2$, moreover, the read control signal $\phi'\cdot\overline{WE}$ goes high to activate sense amplifiers 21a, 21b and 21D. When these sense amplifiers are activated, the potential difference between data lines Da and $\overline{Da}$ is rapidly amplified as shown in FIG. 4. Thereafter, data read out from a memory cell selected by the column decoder is rapidly transmitted to the input-output lines I/O and $\overline{I/O}$.

Figure 5:
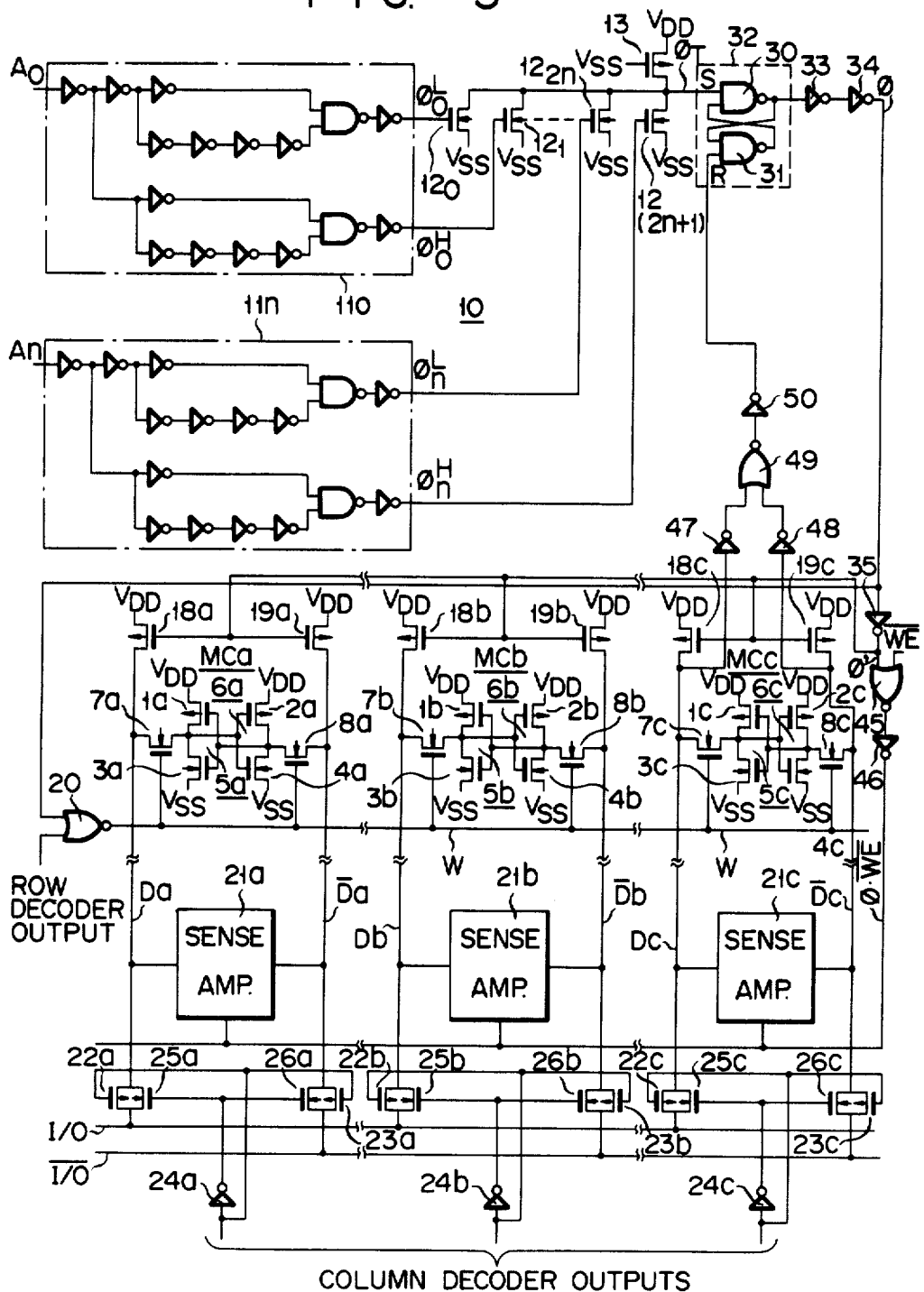
FIG. 5 shows a semiconductor memory device according to a second embodiment of the invention.

Referring now to FIG. 5, a second embodiment of this invention will be described. Like reference numerals are used to designate like portions in the drawings of FIGS. 3 and 5, and description of such like portions will not be repeated below. This second embodiment is not provided with the dummy data line, and is so arranged that the precharging state of actual data lines of a single memory column may be detected. For example, data lines Dc and $\overline{Dc}$, which are connected to power source $V_{DD}$ respectively through precharging transistors 18c and 19c and connected with a typically shown memory cell MCc and a sense amplifier 21c, are detected.

To this end, the data lines Dc and $\overline{Dc}$ are connected with the inputs of inverters 47 and 48 whose outputs are connected to a NOR gate 49. The output of NOR gate 49 is connected to the input of an inverter 50 whose output is connected to the reset input R of flip-flop circuit 32.

When the voltage level of a data line being precharged out of data lines Dc and $\overline{Dc}$ reaches a predetermined level during the precharging period, the output signal of inverter 50 goes low. As a result, the flip-flop circuit 32 is reset to terminate the precharging operation in the same manner as the case of the foregoing embodiment.

It is to be noted that an increase in the load capacitance of data lines Dc and $\overline{Dc}$ resulting from the addition of a precharge detect circuit including inverters 47, 48 and 50 and NOR gate 50 is negligible because the data lines Dc and $\overline{Dc}$ are connected with a large number of memory cells. Therefore, the precharging speeds of data lines for the respective columns are substantially equal.

This invention is not limited to the above-mentioned illustrative embodiments. For example, although complementary MOS transistors are used in RAM's of those embodiments, the memory device of this invention may be formed by using P-channel or N-channel MOS transistors only.

What is claimed is:

1. A semiconductor memory device for outputting data in response to a state transition of an address signal supplied to the device, the device comprising:

a plurality of memory cells arranged in columns and rows;

a plurality of dummy memory cells arranged in a column;

a plurality of pairs of data lines, each of said pairs being connected to said memory cells arranged in a column, one of each of said pairs of data lines being discharged in response to data read out from one of said memory cells arranged in a column;

a dummy data line having substantially the same load capacitance as that of each of said data lines and being connected to said dummy memory cells, said dummy data line being discharged in response to the accessing of one of said dummy memory cells;

precharging means connected to said data lines and said dummy data line for precharging said data lines and said dummy data line prior to the read out of data from said memory cells and to the accessing of said dummy memory cells;

a plurality of first sense amplifiers, each of said first sense amplifiers being connected to a different one of said pairs of data lines and for discharging one of said data lines coupled thereto responsive to the read out of data from one of said memory cells connected to said one data line to amplify the data read out of the memory cell;

a second sense amplifier connected to said dummy data lines, said second sense amplifier for discharging said dummy data line responsive to the accessing of one of said dummy memory cells;

precharge detect circuit means connected to said dummy data line for detecting a precharging state of said dummy data line;

address signal state transition detector means for receiving the address signal and for detecting a state transition of said address signal; and control circuit means connected to said state transition detector means and said precharge detect circuit means, said control circuit means for changing from a first state to a second state in response to a state transition of said address signal to cause said precharging means to precharge said data lines and said dummy data line, and to change state from said second state to said first state in response to the precharging of said dummy data line to a predetermined voltage level to disable said precharging means from precharging said data lines and said dummy data line.

2. A semiconductor memory device for outputting data in response to a state transition of an address signal supplied to the device, the device comprising:

a plurality of memory cells arranged in columns and rows;

a plurality of pairs of data lines, each of said pairs of data lines being connected to said memory cells arranged in a different one of said columns, one of each of said pairs of data lines being discharged in response to the read out of data from one of said memory cells arranged in a column;

precharging means connected to said data lines for precharging said data lines prior to the read out of data from said memory cells;

a plurality of first sense amplifiers, each of said first sense amplifiers being connected to a different one of said pairs of data lines to discharge said data line connected thereto responsive to the read out of data from one of said memory cells connected to said data line to amplify the data read out of said one memory cell;

precharge detect circuit means connected to a predetermined pair of said plurality of pairs of data lines for detecting a precharging state of said predetermined pair of data lines;

address signal state transition detector means for receiving the address signal and for detecting a state transition of said address signal; and control circuit means connected to said state transition detector means and said precharge detect circuit means, said control circuit means for changing from a first state to a second state in response to a state transition of said address signal to cause said precharging means to precharge said data lines, and to change from said second state to said first state in response to the precharging of said predetermined pair of data lines to a predetermined voltage level to disable said precharging means from precharging said data lines.

3. A semiconductor memory according to any one of claims 1 or 2, wherein said memory cells each include a flip-flop circuit.

4. A semiconductor memory according to any one of claims 1 or 2, wherein said control circuit means includes cross-coupled NAND gates.

* * * * *